Feb. 23, 1971 D. W. ACKERMAN 3,564,691

UNIT CARRIER FED ELECTRONIC COMPONENT INSERTION MACHINE

Filed Sept. 20, 1968 3 Sheets-Sheet 1

INVENTOR,
DANIEL W. ACKERMAN
BY Fidelman, Wolffe & Leitner
ATTORNEYS

UNIT CARRIER FED ELECTRONIC COMPONENT INSERTION MACHINE

Filed Sept. 20, 1968 3 Sheets-Sheet 2

INVENTOR,
DANIEL W. ACKERMAN
BY Fidelman, Wolffe & Leitner
ATTORNEYS

INVENTOR,
DANIEL W. ACKERMAN
BY Fiddleman, Wolffe & Leitner
ATTORNEYS 3,564,691

UNIT CARRIER FED ELECTRONIC COMPONENT INSERTION MACHINE

Daniel W. Ackerman, Chenango Bridge, N.Y., assignor to Universal Instruments Corporation, Binghamton, N.Y., a corporation of New York Filed Sept. 20, 1968, Ser. No. 761,229
Int. Cl. H05k *13/04*
U.S. Cl. 29—203 17 Claims

ABSTRACT OF THE DISCLOSURE

An insertion apparatus for inserting dual inline unit carrier mounted electrical components directly into a board, the components having depending leads on opposite sides thereof and the unit carrier including side flanges. The apparatus comprises an inserter means adapted to reciprocate along a fixed path, a unit carrier positioning means having unit carrier flange engaging means thereon to position said unit carrier in alignment with the path of said inserter means, and a carrier feeding arrangement adapted to supply unit carriers with components to said positioning means during each operational cycle of said inserter means. The inserter means passing through the unit carrier in forcing the component into said board.

The present invention relates to an apparatus for inserting electrical components into a circuit board and, more particularly, to an improved insertion head for such an apparatus for handling carrier-mounted electrical components, particularly multi-lead modules. Modules are characterized by a design in which a plurality of substantially L-shaped leads extend from opposite side surfaces of a component body portion.

Machines have been developed over the past ten years for the insertion of multi-lead components. The Ackerman et al. Pat. 3,254,821, issued June 7, 1966, represents one of the early efforts on thread lead transistor insertion while the Ragard Pat. 3,313,022, issued May 14, 1968, utilized similar techniques for module insertion for modules with multi-leads extended from one face as in the case of the transistors. More recently as shown in the Ackerman application, Ser. No. 574,394, filed Aug. 23, 1966, now Pat. No. 3,442,430, machines have been developed for insertion of modules where the leads are L shaped and extend from two sides of the component. In each of these machines the insertion assembly included a component support, are reciprocal component inserter which is adapted to pick up a component from the component support and thereafter insert the same into a circuit board, and a component feeding assembly adapted to transfer components one at a time onto the component support from a suitable supply.

In co-pending application, Ser. No. 574,394, now Pat. No. 3,442,430 where the problem of inserting multi-lead L-shaped modules was faced, means were proposed to positively position the module with respect to a circuit board during travel of the module to the insertion position and included comb type guides operable during motion of said component inserter toward an insertion position to align, straighten and guide the leads of the component. However, such an apparatus was designed to accommodate single modules presented through a chute without individual support for each component. In other words, when the component was positioned in the head there was nothing present which was not to be inserted.

The "unit carrier" concept is relatively new to the electronic component apparatus industry, its use stemming from the need for careful handling of the L-shaped leads extending from the opposite sides of the module. Most unit carriers feature outside physical parameters compatible to all dual in-line module packages, and with such a carrier, a user can handle all suppliers with the same test and storage equipment. The advantages of using a unit carrier, when handling components, are increased economy of operation due to fewer rejected components and lower scrap loss and their applicability to environmental testing. The carriers house and protect the modules throughout the test and storage portions of module use but until the present invention the modules had to be taken out of the carriers before the insertion operation.

Accordingly, it is a general object of this invention to provide an electronic component insertion apparatus for components confined in unit carriers that will meet all of the above desiderata.

It is a more specific object of this invention to provide an improved insertion head and transfer mechanism for an apparatus such as disclosed in co-pending application Ser. No. 574,394, filed Aug. 23, 1966, now Pat. No. 3,442,-430 to enable such apparatus and others of a like kind to handle modules while still in unit carriers, thus eliminating the necessity of ejecting the module from the carrier before the insertion operation.

It is a further object of the present invention to provide an insertion apparatus means to engage and position unit carriers holding electrical components, such as dual in-line package modules, and to directly plunge the component out of the carrier into a board.

It is further object of the present invention to provide an insertion apparatus head assembly having means to positively position a unit carrier with respect to a circuit board during travel of the carrier to insertion position.

A still further object is to provide an insertion apparatus having inserter means operable to push the module out of the unit carrier and guide means which align the leads of the module with the circuit board out of the module and then pivot out of the way to allow further travel of the module out of the carrier and into the circuit board.

A still further object of the instant invention is the provision of a unit carried module insertion apparatus which may be supplied by a conventional means such as conveyors, chutes, bulk carriers, or magazines.

These and other objects of the present invention will become apparent from the following description taken with the accompanying drawings, in which.

Figures 1, 2:
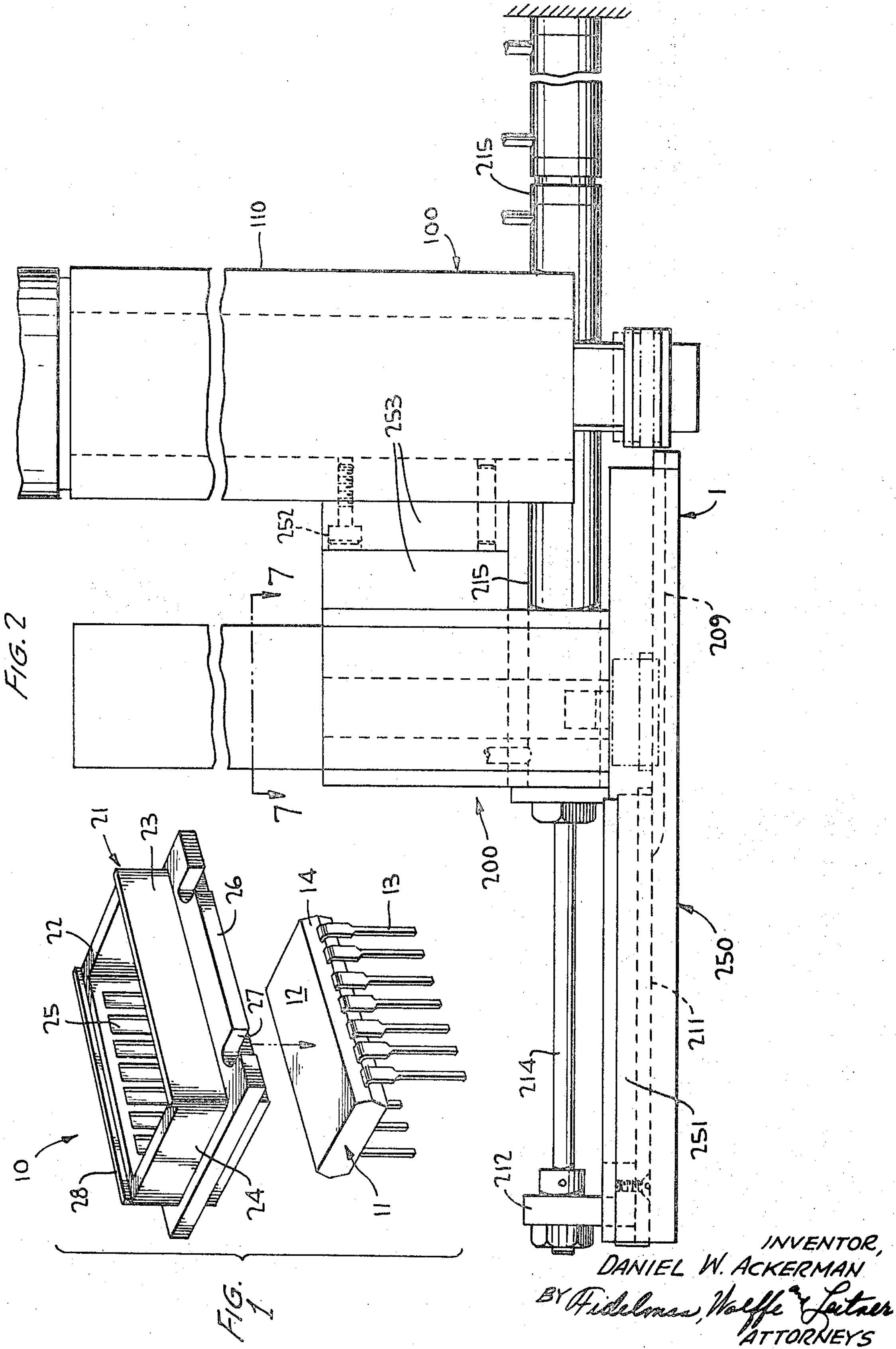
FIG. 1 is a perspective view of a unit carrier and an associated module.
FIG. 2 is a front elevational view of the insertion apparatus of the present invention showing the relative arrangement of the magazine, inserter and transfer mechanism.
Figures 3, 4, 5, 5A:
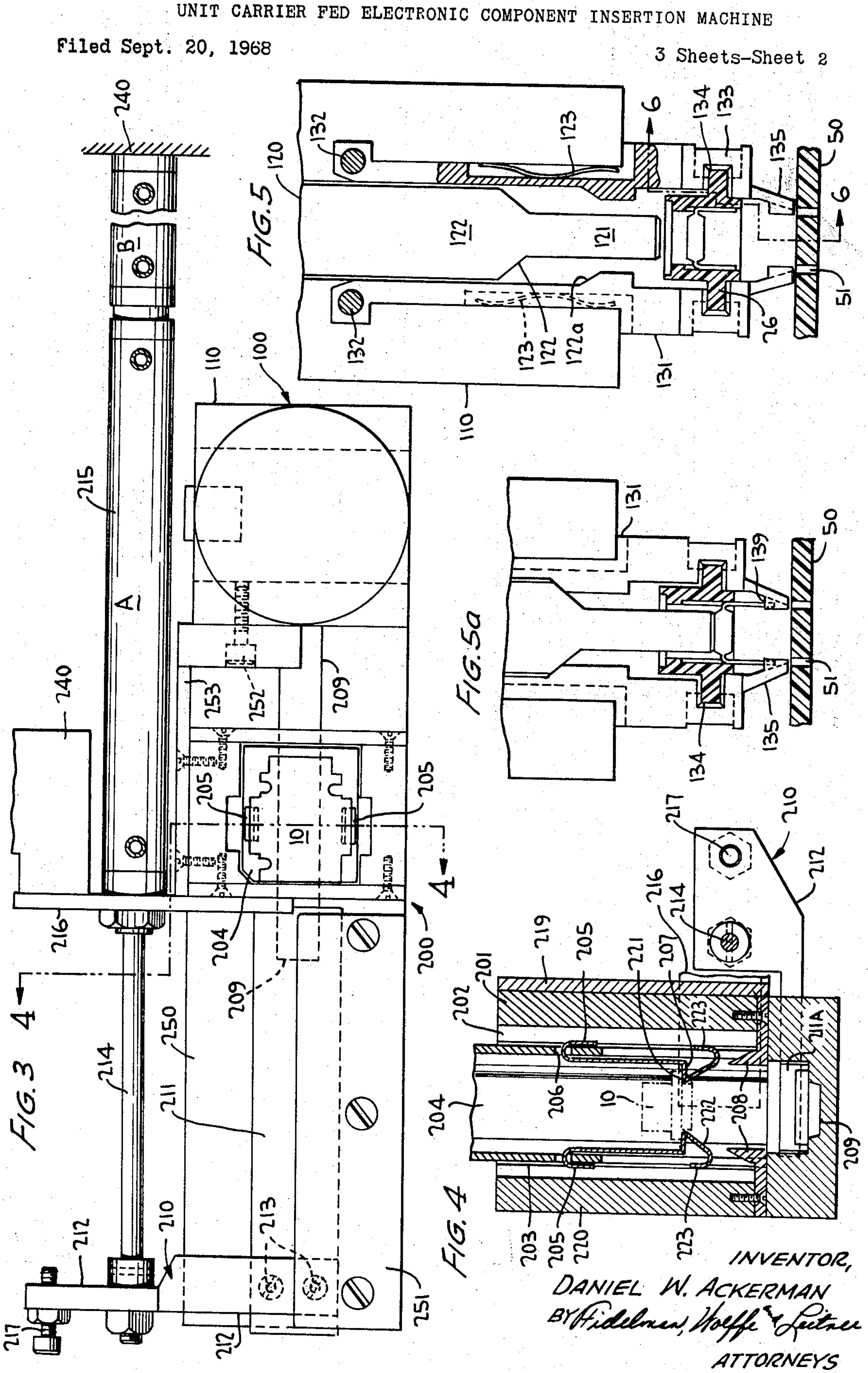
FIG. 3 is a top plan view of the insertion apparatus showing the transfer mechanism and its hydraulic cylinder operating means.
FIG. 4 is a sectional view taken along line 4—4 of FIG. 3.
FIG. 5 is a fragmentary view illustrating the structure of the inserter head and related cam and guide structures. The component inserter is shown in a raised position above a unit carrier loaded with a module.
Figure 6:
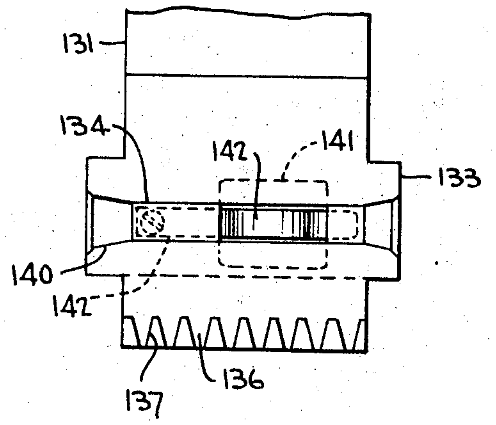
Figure 7:
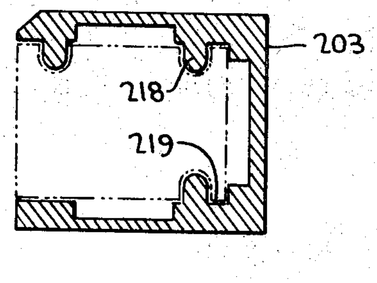

FIG. 5*a* is a view similar to FIG. 5 but showing the component inserter engaging the module;

FIG. 6 is a sectional view taken generally along line 6—6 in FIG. 5;

FIG. 7 is a sectional view taken generally along line 7—7 in FIG. 2; and

Figure 8A:
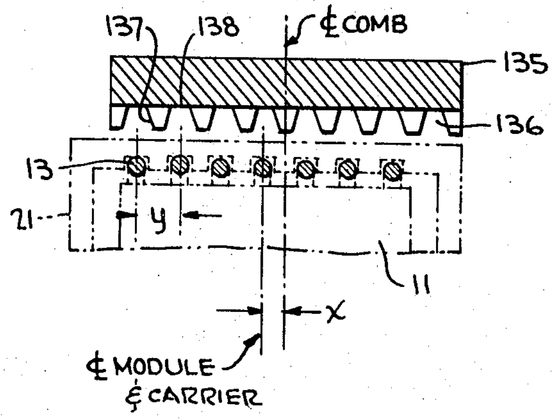
Figure 8B:
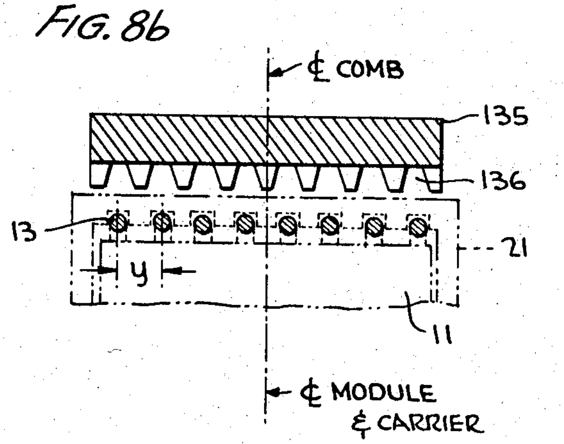

FIGS. 8*a* and 8*b* are side sectional views of a module loaded unit carrier with the former illustrating loading of a seven lead module and the latter, an eight lead module.

The component insertion apparatus of the present invention is generally designated as 1 in FIG. 2. The device is similar to the component insertion apparatus disclosed in co-pending application, Ser. No. 574,394, filed Aug. 23, 1966, now Pat. No. 3,442,430, with certain modifications, explained below, which permit the apparatus to handle unit carriers. The entire disclosure of Ser. No. 574,394, now Pat. No. 3,442,430, is incorporated by reference herein. The following paragraph refers to numbers from said application not appearing in the drawings attached to the instant application.

The insertion head is substantially identical to that disclosed in Ser. No. 574,394, now Pat. No. 3,442,430, except that the chute portion 500 and its accompanying feeder mechanism 600 have been removed, the two support members 301 and 302 removed, the resilient component positioning portions 240 and 241 have been replaced by pivoted support members and cam plate 260 has been removed.

Referring to FIG. 2, of the instant application, the component insertion assembly is indicated by 100 and the component feeding assembly is indicated as 200, both being mounted on a suitable apparatus framework (not shown).

The apparatus of the present invention is particularly adapted for use in inserting module from carrier arrangements as shown in FIG. 1 and indicated as 10. Module 11 has a body portion and a plurality of L-shaped leads 13 depending from a pair of opposed side surfaces 14. Normally leads 13 are of equal length and extend a substantial distance below body 12. There may be seven leads on each side of the body 12 as illustrated in FIG. 1 but it is understood that there may be any number of leads of any desired spacing or length.

The carrier 21 has a hollow rectangular body portion 22 having a pair of long side walls 23 and shorter connecting side walls 24. Internal surfaces of the long side walls 23 are grooved as at 25. Grooves 25 are generally rectangular and extend from the inside bottom edge of each inside wall surface to a point short of the surface top edges. The grooves 25 receive the legs of leads 13 and thus snugly receive module 11 within the opposed long side walls. Rectangular flange 26 extends around the outside of carrier 21 and is notched as at 27.

As seen in FIG. 1, there are flanges 28 on the uppermost edge of long side walls 23. This is to allow air stacking in a magazine carrier. The flanges 28 of a carrier 21 engage the bottom of another unit carrier loaded on top of carrier 21. The width of the bottom portion of each carrier is slightly less than the width f the short side walls 24 located above peripheral flange 26 to grip the bottom long side edges of the carrier loaded on top of it. The carrier depicted is that of the Barnes Development Company and is further described in the Hohl article in Electronic Packaging and Production, January 1968.

In use, as shown in FIG. 7, notches 27 function to locate the carrier within magazine 203 by engaging projections 218 on the inside surfaces 219 of magazine 203.

The component inserter assembly 100 is shown in FIGS. 2, 3, 5 and 5*a* as including a housing 110, a component inserter which is generally designated as 120 and is adapted to be vertically reciprocated with respect to housing 101 by means of a suitably actuable power means such as a fluid actuated cylinder (not shown) and a carrier support which is generally designated as 130 and adapted to support carriers fed into the inserter assembly by the feed assembly 200 in position to be pushed one at a time into the circuit board 50 from the carrier (FIGS. 5 and 5*a*).

As described above, the housing and component inserter and actuating power means are substantially identical to that disclosed in Ser. No. 574,394 and their details may be derived therefrom. Referring specifically to FIGS. 5, 5*a* and 6, the support 130 includes two pivotable support arms 131 pivoted at their uppermost extremities on pivot pins 132 which are secured to housing 110. The lower sections of arms 131 contain support sections 133 which have slotted portions 134 proportioned to receive the flanges 26 of module carriers 21. The unit carrier 21 is received between the support arms 131 and held in place by flange 26 engaging slots 134. The support springs 123 resiliently urge arms 131 together. Depending from the lower portions of support sections 133 are guides or combs 135. Guides 135 depend angularly downward toward the center line of inserter 120 and have generally wedge-shaped notches 136 as seen in FIGS. 6, 8*a* and 8*b*.

FIGS. 8*a* and 8*b* show the alignment of lead guides or combs 135, the carrier 21 and module 12. Guides or combs 135 have notches 134 to correspond with carrier grooves 25 and module leads 13.

FIG. 8*a* shows a seven groove carrier and a seven lead module combination, whereas FIG. 8*b* illustrates a carrier used to hold an eight lead module. As is illustrated, the distance between the leads on both the seven and eight lead modules is denoted by $y$. The center lines of the comb 135 and carrier are coincident with the center line of the module in FIG. 8*b*. In FIG. 8*a*, however, the coincident center lines of the comb and carrier are offset from the center line of the module by an increment designated by $x$. The outside dimensions of the unit carriers, however, are generally uniform regardless of the number of leads the module 11 has. Thus, when a seven lead module carrier is used, the carrier shifts slightly since the module is centered within the carrier. The shifting aligns the leads on the module with the combs.

As seen in vertical cross-section in FIG. 8*a*, notches 136 have generally vertical walls 137 tapering inwardly to a vertical base wall 138. In horizontal view as shown in FIG. 6, notches 136 are wedge shaped and the walls 137 of each notch diverge upwardly. In side view as in FIGS. 5 and 5*a* the area included by notches 136 is substantially an acute triangle with the base surface 139 being disposed on top. Thus, the walls of notches 136 diverge upwardly and the vertical cross-sectional area of the notches at a given horizontal plane increases in an upward direction. During the insertion operation the leads 13 of module 11 enter the topmost part of notches 136 and then are guided or combed downwardly until they egress from the bottom-most part which serves to accurately align them with the holes 51 in circuit board 50.

As is best seen in FIG. 6, module flange receiving slots 134 extend transversely of arms 131 and are outwardly flared at their ends as indicated by 140. Located on one of support arms 131 there is transverse opening 141. A carrier retaining spring clip 142 can be received within or can project through transverse opening 141. The spring clip 142 holds the carrier 21 against transverse movement with slots 134.

The component feeding assembly shown in FIGS. 2, 3 and 4 includes a magazine holder 201 and a pusher assembly 210. The magazine holder 201 as well as the pusher assembly 210 are mounted on feed base 250 which is attached to the inserter assembly 100 by bolts 252 passing through an upright L-shaped support 253 which includes a stepped portion through which the rod 211 passes. The magazine holder 201 includes holder slots 202 for a magazine spring (not shown). Magazine 203 has a central passageway 204 in which carrier-module units 10 are stacked. Preventing units 10 from falling down through passageway 204 are magazine mounted unit carrier retaining springs 205. Springs 205 are mounted in apertures 206 in the side walls of magazine 203. A section 222 of the spring depends downwardly therefrom. The springs 205 include inwardly bent portions 207 which form carrier seat areas 221. Depending downwardly from said seat area in an angular outward direction the spring terminates in upturned portions 223 which abut holder slot 202. Mounted at the base of magazine holder 201 are spring deflectors 208 which engage the upturned portions 223 of retaining springs 205 when the magazine is fully inserted into the holder allowing the lowermost carrier-module to be dropped into the module-carrier feed slot 209 in the base 250 where it becomes engaged, during operation of the apparatus, by carrier-module pusher generally designated 210.

As shown in FIGS. 2 and 3, the pusher 210 consists of rod 211 having a carrier engaging face 211A which is secured to a cross-bar 212 by bolts 213. Cross bar 212 is in turn bolted or otherwise secured to the piston rod 214 of module pusher actuating cylinder 215. The actuating cylinder is secured at one end to the apparatus base 240, only partially shown, by means of plate 216 and its other end abuts another portion of base 240. As illustrated in FIG. 3, cross bar 210 has a threaded adjustment bolt 217 secured thereto. The adjustment of bolt 217 determines the length of the stroke of piston rod 214 and, in turn, pusher 210. Bolt 217 is adjusted to change the stroke for a seven lead module, i.e. do shift it over so as to align the leads and the combs. Actuating cylinder 215 may consist of a main cylinder A and back up cylinder B which may be employed to give a second extension stroke to eject the empty carriers. A guide plate 251 attached to base 250 serves to keep rod 211 in alignment during the travel thereof.

OPERATION OF APPARATUS

Having described the structural configuration of the chosen embodiment, what follows is a description of the operation of the machine. Magazine 203 is moved downwardly in magazine holder 201 under the influence of any suitable power means (not shown) or by hand whereupon retaining springs 205 engage deflectors 208 releasing a carrier-module unit 10 which falls into feed slot 209. Cylinder 215 is then actuated thereby moving face 211A of pusher rod 211 against the unit 10 and carrying it to the support section 130 of the insertion apparatus. The unit is pushed between support arms 131 with carrier flanges 26 engaging holding slots 134. The pusher rod 211 is retracted and thereafter inserter 120 is activated and moved downwardly. Inserter head 121 engages the module and ejects it through the carrier with the module leads 13 slidably engaging notches 136 in combs 135. As the module progresses downwardly, leads 13 are guided into exact alignment with apertures 51 in circuit board 50. When the module body 12 has completely passed out of carrier 21 and leads 13 are entering the circuit board aperatures 51 as seen in FIG. 5*a*, the inserter camming surfaces 122 engage their counterpart surfaces **122*a* on support arms 131 and promote a pivoting of arms 131 about pins 132. Thus, arms 131 are swung away from the path of the inserter against springs 123. Such action provides clearance for the inserter to continue to press module 11 into circuit board 50 until flush therewith, as the length of travel of arms 131 outwardly is controlled so that carrier 21 is still supported by slots 134 during maximum outward extension. When the module is inserted, inserter 120 retracts upwardly allowing support springs 123 to force arms 131 back into the position shown in FIG. 5. After retraction of inserter 120, the empty carrier 21 can be independently ejected by a further extension of the stroke of pusher rod 211 by cylinder B or can be displaced by another unit 10 moving into the support assembly 130 from the component feeding assembly 200**. The ejected carrier falling from the assembly into a collector bin or the like, not shown.

While the operation of the machine has been described with some detail, it is understood that it is basically that of the apparatus described in co-pending application Ser. No. 574,394, filed Aug. 23, 1966.

It is further understood that the component feeding assembly 200 need not be of the magazine type but may be a vibratory bowl and track type arrangement adapted to hold unit carriers in which the carrier is fed down a track from the vibratory bowl to the insertion head. Further, the feeding assembly may be a singular or multiple magazine arrangement feeding onto a conveyor which, in turn, delivers the carrier to the insertion head. It may also be similar to that shown in application Ser. No. 574,394, filed Aug. 23, 1966, or may be modified to accommodate the multisize component feed as disclosed in the Zemek et al. application Ser. No. 717,627, filed Apr. 1, 1968.

The controls employed by the present apparatus form no part of the present invention and are not discussed in detail. It will be apparent, however, to one skilled in the art that numerous well known controls may be employed, such as pneumatic, hydraulic or electrical control systems.

Although the description of the invention has been detailed, variation and modification can be effected within the spirit and scope of the invention as described hereinabove and as defined in the appended claims.

What I claim is:

1. An apparatus for inserting unit carrier mounted electrical components into a board, said components having depending leads on opposite sides thereof, said unit carrier including side flanges, said apparatus comprising an inserter means adapted to reciprocate along a fixed path, a unit carrier positioning means having unit carrier flange engaging means thereon to position said unit carrier in alignment with the path of said inserter means, said positioning means including depending guide means for aligning the leads of the components with preformed apertures in said board, said guide means comprising opposed comb sections having juxtapositioned tapered grooves therein.

2. The apparatus of claim 1 wherein said component positioning means includes pivotable members, said members being adapted to position one unit carrier at a time in alignment with the path of reciprocation of said inserter and to pivot away from the path of reciprocation of said inserter means during the terminal portion of the reciprocation.

3. The apparatus of claim 2 wherein said inserter means has camming surfaces thereon and said pivoted members have cam surfaces, whereby movement of said inserter means along said path of reciprocal movement engages the respective cam surfaces and causes said members to pivot outwardly to allow for further progression of said inserter means.

4. The apparatus of claim 1 wherein said support means includes sections having opposed slots therein, said slots adapted to receive flanges of a unit carrier.

5. The apparatus of claim 4 wherein at least one of said opposed slots has a resilient biasing means therein to firmly secure a unit carrier in said support means.

6. An apparatus as in claim 1 wherein said component supply means comprises a magazine, a feed slot aligned with said unit carrier positioning means, means to dispense unit carriers containing modules from said magazine into said feed slot and pusher means to move said carrier into said positioning means.

7. An apparatus as in claim 6 wherein said means to dispense unit carriers from said magazine comprises carrier retaining springs mounted in said magazine and spring deflecting means located so as to deflect said springs whereby one carrier per operational cycle of the apparatus is positioned in said feed slot.

8. An apparatus as in claim 6 wherein said pusher means comprises a pusher member aligned with said feed slot, power cylinder and piston rod means to operate said member, and adjustment means to adjust the length of stroke of said piston rod and member.

9. An insertion head for a dual in-line package insertion apparatus for handling unit carriers, comprising, a body, an inserter head mounted in said body for reciprocal movement along a fixed path, unit carrier positioning means mounted on said body and adapted to position a unit carrier in the path of said inserter head during each operational cycle thereof, said positioning means adapted to swing away from the path of the inserter means after it passes through the unit carrier in forcing the component into a board.

10. An insertion head as in claim 9 wherein guide means are provided on said positioning means to align the leads of a component mounted in a unit carrier.

11. An insertion head as in claim 10 wherein said guide means comprises depending combs having juxtapositioned tapered grooves therein.

12. An insertion head as in claim 9 wherein said positioning means includes pivotally mounted members adapted to pivot away from the path of reciprocation of said inserter means.

13. An insertion head as in claim 12 wherein said inserter means has at least one camming surface thereon which interacts with corresponding surfaces on said pivoted members to cause the latter to pivot away from the inserter path.

14. An insertion head as in claim 9 wherein said positioning means includes sections having opposed slots therein which are adapted to engage the flanges of a unit carrier.

15. An insertion head as in claim 9 wherein said positioning means comprising pivotally mounted elongated members having inclined surfaces thereon, said inserter head having camming surfaces adapted to interact with said inclined surfaces thereby causing the members to pivotally swing away from the path of said inserter head and from each other, said members having support sections thereon with opposed slots in said sections to engage unit carrier flanges and guide means on the end of said members opposite their pivot point for aligning the leads of components mounted in said unit carriers.

16. An insertion head as in claim 15 wherein at least one of said slots has a resilient biasing means associated therewith for snugly positioning a unit carrier in said slots.

17. An apparatus as in claim 15 wherein said guide means comprise combs having tapered grooves.

References Cited

UNITED STATES PATENTS

| | | | |
|---|---|---|---|
| 3,254,821 | 6/1966 | Ackerman et al. | 227—119 |
| 3,442,450 | 5/1969 | Ackerman et al. | 227—2 |
| 3,443,297 | 5/1969 | Lusby, Jr. | 29—206X |

THOMAS H. EAGER, Primary Examiner

U.S. Cl. X.R.

29—206